United States Patent
Park et al.

(10) Patent No.: US 7,394,261 B2
(45) Date of Patent: Jul. 1, 2008

(54) SEMI-CONDUCTOR CHIP PACKAGE CAPABLE OF DETECTING OPEN AND SHORT

(75) Inventors: Chang-Su Park, Suwon-si (KR); Heung-Woo Park, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 11/546,594

(22) Filed: Oct. 11, 2006

(65) Prior Publication Data

US 2007/0080704 A1    Apr. 12, 2007

(30) Foreign Application Priority Data

Oct. 11, 2005 (KR) ............... 10-2005-0095329
Sep. 12, 2006 (KR) ............... 10-2006-0088240

(51) Int. Cl.
  *G01R 31/02* (2006.01)
(52) U.S. Cl. .................... 324/537; 324/158.1
(58) Field of Classification Search ............. None
  See application file for complete search history.

(56) References Cited

U.S. PATENT DOCUMENTS

| | | | | |
|---|---|---|---|---|
| 3,835,530 A * | 9/1974 | Kilby | ............... | 438/6 |
| 3,974,443 A * | 8/1976 | Thomas | ............... | 324/716 |
| 3,983,479 A * | 9/1976 | Lee et al. | ............... | 324/537 |
| 4,347,479 A * | 8/1982 | Cullet | ............... | 324/716 |
| 4,386,459 A * | 6/1983 | Boulin | ............... | 438/11 |
| 4,918,377 A * | 4/1990 | Buehler et al. | ............... | 324/691 |
| 5,311,360 A | 5/1994 | Bloom | | |
| 5,821,765 A * | 10/1998 | Ling et al. | ............... | 324/765 |
| 6,362,634 B1 * | 3/2002 | Jarvis et al. | ............... | 324/719 |
| 6,369,865 B2 * | 4/2002 | Hinata | ............... | 349/12 |
| 6,380,554 B1 * | 4/2002 | Bush et al. | ............... | 257/48 |
| 6,564,986 B1 * | 5/2003 | Hsieh | ............... | 228/103 |
| 6,842,028 B2 * | 1/2005 | Song et al. | ............... | 324/763 |
| 7,348,594 B2 * | 3/2008 | Ciplickas et al. | ............... | 257/48 |

* cited by examiner

*Primary Examiner*—Ha Nguyen
*Assistant Examiner*—Richard Isla-Rodas
(74) *Attorney, Agent, or Firm*—Christensen O'Connor Johnson Kindness PLLC

(57) ABSTRACT

A semiconductor chip package capable of detecting an open and a short is disclosed, comprising: a first pad group comprising a plurality of first substrate pad sub groups, formed on a substrate, each composed of first substrate pads electrically connected, and insulated from each other, and a plurality of first element pad sub groups formed on an element and composed of first element pads electrically connected such that each first substrate pad sub group is electrically connected through the first element pads corresponding to the first substrate pads; a second pad group electrically insulated from the first pad group when the element is connected to the substrate, and comprising a plurality of second substrate pad sub groups formed on the substrate, composed of second substrate pads electrically connected, and insulated from each other, and a plurality of second element pad sub groups formed on the element, and composed of second element pads electrically connected such that each second substrate pad sub group is electrically connected through the second element pads corresponding to the second substrate pads; a plurality of first measuring pads electrically connected with the first pad group; and a plurality of second measuring pads electrically connected with the second pad group, wherein an open between the pads is detected by checking a connected state between the first or second measuring pads, and a short between the pads by checking a connected state between the first and second measuring pads.

19 Claims, 7 Drawing Sheets

SEMI-CONDUCTOR CHIP PACKAGE CAPABLE OF DETECTING OPEN AND SHORT

BACKGROUND

1. Technical Field

The present invention provides a pattern for testing a connected state of a semiconductor device, in particular, to a semiconductor chip package capable of detecting an open and a short.

2. Description of the Related Art

A conventional method for connecting a semiconductor chip to a substrate includes a wire bonding method and a flip chip bonding method. The wire bonding method adheres a chip to a lead frame, connects a pad of the chip to a terminal with a bonding wire, and seals them with a resin. Meanwhile, the flip chip bonding method adheres a chip to an epoxy or ceramic substrate, and forms a flip chip ball grid array package (FCB, hereinafter referred to as "flip chip package") by using a solder ball as a terminal. In such a flip chip bonding method, an element (or a chip) is assembled in face down orientation onto a substrate. This flip chip bonding method has a high space efficiency, and is strong against electromagnetic interference even in a high frequency wave, because it uses thick and short connecting wires. Furthermore, performing a batch processing, the flip chip bonding method incurs less manufacturing cost than the wire bonding method. Even with all those merits, the flip chip bonding method is currently applied only in a micro processor operating at a gigahertz level, and a high speed logic IC for networks devices, since solder balls and pads, etc. are expensive. However, with increasing demands on a noise control, the flip chip bonding method is steadily substituting for the wire bonding method.

A semiconductor chip package using the wire bonding or flip chip bonding method needs a number of dispositions, solderings, and other processes. Accordingly, to improve the qualities of the semiconductor chip package, testing and inspection are necessary. Malfunctioning of the semiconductor chip package is mainly caused by its component chips, and bare boards during component-injecting processes or soldering processes. Examples of such malfunctions are wrong values or labels, poor circuit performances, open circuits, short circuits, wrong positioning of the components, physical damage, improper soldering, damaged or open lands, and out of tolerance condition. The descriptions below will focus on a forming method of a semiconductor chip package using the flip chip bonding method.

FIG. 1 shows a pattern for testing a connected state of a flip chip by using a daisy chain, in a flip chip connection testing semiconductor chip package according to a prior art. In FIG. 1 are illustrated a substrate 110, an array of substrate bumps 120, an array of element pads 130, and four measuring pads 140 formed around corners of the substrate 110.

The substrate 110 is a typical printed circuit board, and has a wiring formed according to a particular pattern. On the substrate 110 is formed an array of the substrate bumps 120. The substrate bump 120 is electrically connected with the element pad 130 formed in a semiconductor element. For convenience, the body of the semiconductor element is omitted in FIG. 1.

Here, in order to detect an open area between the substrate bump 120 and the element pad 130, the element pads 130 are electrically connected in pairs, and the substrate bumps 120 are electrically connected in pairs such that the pairs of the element pads 130 that are not electrically connected are now electrically connected with each other through the electrical connection of the pairs of the substrate bumps 120. With this, when the substrate bump 120 and the element pad 130 are normally connected with each other, an open can be detected by measuring a resistance between the measuring pads 140.

However, such a test pattern cannot detect a short. With advances in substrate technologies, more fine pitches are required, and thus the semiconductor chip package is more likely to have a short. Consequently, there has been a need for a test pattern detecting the short.

SUMMARY

Accordingly, the present invention aims to provide a semiconductor chip package capable of detecting an open and a short of the semiconductor chip package.

Also, the present invention aims to provide a semiconductor chip package capable of detecting an open and a short by designing a test pattern for checking a connected state between an element and a substrate of a semiconductor product.

Also, the present invention aims to provide a semiconductor chip package with diverse wiring forms capable of detecting an open and a short.

Also, the present invention aims to provide a semiconductor chip package capable of detecting an open and a short for a substrate with a fine pitch circuit.

Additional aspects and advantages of the present general inventive concept will be set forth in part in the description which follows, and in part will be obvious from the description, or may be learned by practice of the general inventive concept.

One aspect of the present invention provides a semiconductor chip package capable of detecting an open and a short, comprising: a first pad group comprising a plurality of first substrate pad sub groups, formed on a substrate, each composed of first substrate pads electrically connected by a wiring, and insulated from each other, and a plurality of first element pad sub groups formed on an element and composed of first element pads connected by a wiring such that each first substrate pad sub group is electrically connected through the first element pads corresponding to the first substrate pads; a second pad group electrically insulated from the first pad group when the element is connected to the substrate, and comprising a plurality of second substrate pad sub groups formed on the substrate, composed of second substrate pads electrically connected by a wiring, and insulated from each other, and a plurality of second element pad sub groups formed on the element, and composed of second element pads connected by a wiring such that each second substrate pad sub group is electrically connected through the second element pads corresponding to the second substrate pads; a plurality of first measuring pads electrically connected with the first pad group; and a plurality of second measuring pads electrically connected with the second pad group, wherein an open between the pads is detected by checking a connected state between the first or second measuring pads, and a short between the pads by checking a connected state between the first and second measuring pads.

Here, the first substrate pad sub group and the second substrate pad sub group are arranged alternatively and sequentially.

Here, the first substrate pad sub group is formed of a pair of the first substrate pads, or the second substrate pad sub group is formed of a pair of the second substrate pads.

Here, the element is an optical modulator or a drive IC driving the optical modulator.

Here, the substrate is a transparent substrate.

Here, the first and second substrate pads are arranged in an areal pattern or in a peripheral pattern.

Here, the number of the first measuring pads is two, and the number of the second measuring pads is two.

Here, the plurality of the first measuring pads are formed at both ends of the first pad group, or the second measuring pads are formed at both ends of the second pad group.

Here, the element is connected to the substrate by a wire bonding method or a flip chip bonding method.

BRIEF DESCRIPTION OF THE DRAWINGS

These and other features, aspects, and advantages of the present invention will become better understood with regard to the following description, appended claims, and accompanying drawings where:

DETAILED DESCRIPTION

Hereinafter, embodiments of the invention will be described in more detail with reference to the accompanying drawings. In the description with reference to the accompanying drawings, those components are rendered the same reference number that are the same or are in correspondence regardless of the figure number, and redundant explanations are omitted.

An optical modulator can be divided mainly into a direct type, which directly controls the on/off state of light, and an indirect type, which uses reflection and diffraction. The indirect type may be further divided into an electrostatic type and a piezoelectric type. Here, optical modulators are applicable to the embodiments of the present invention regardless of the operation type or their product names (for example, a GLV device manufactured by Silicon Light Machine Co., Ltd.).

An electrostatic type grating optical modulator as disclosed in U.S. Pat. No. 5,311,360 includes a plurality of equally spaced-apart deformable reflective ribbons having reflective surfaces and suspended above the upper part of the substrate.

First, an insulation layer is deposited onto a silicon substrate, followed by the deposition of a sacrificial polysilicon dioxide film and a silicon nitride film.

The silicon nitride film is patterned with the ribbons, and some portions of the polysilicon film are etched so that the ribbons are maintained by the nitride frame on the polysilicon spacer layer. The ribbon and the polysilicon spacer of the optical modulator are designed to have a thickness of $\lambda_0/4$ in order to modulate a light having a single wavelength $\lambda_0$.

The grating amplitude, of such a modulator limited to the vertical distance d between the reflective surfaces of the ribbons and the reflective surface of the substrate, is controlled by supplying voltage between the ribbons (the reflective surface of the ribbon, which acts as the first electrode) and the substrate (the conductive film at the bottom portion of the substrate, which acts as the second electrode).

Figure 1:
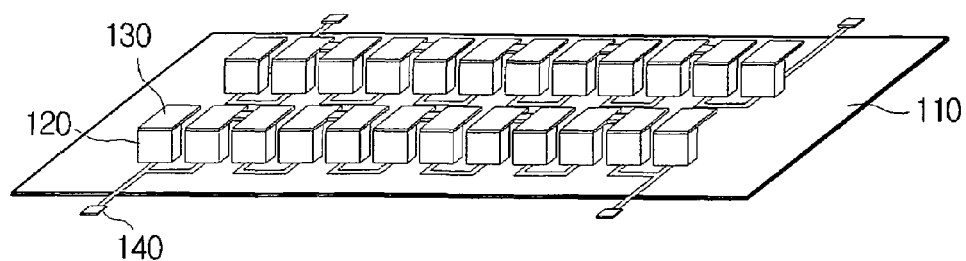
FIG. 1 illustrates a flip chip connection testing semiconductor chip package according to a prior art.
Figure 2A:
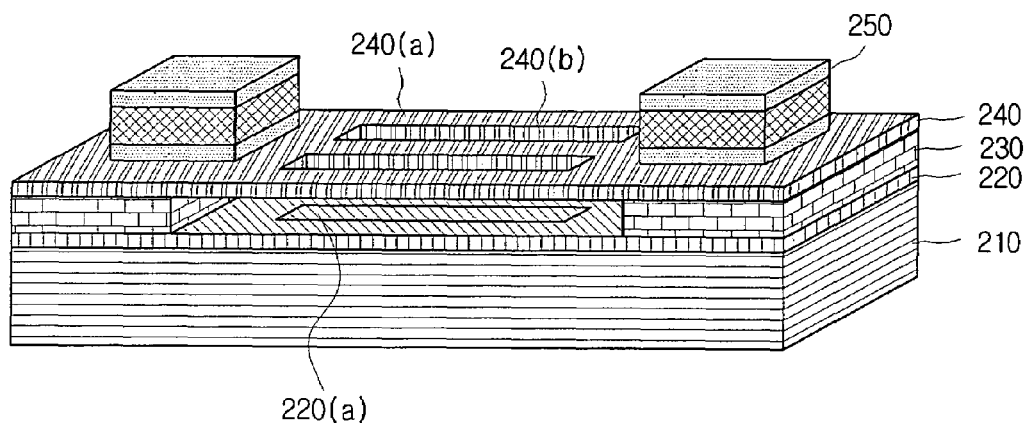
FIG. 2A is a perspective view of a diffraction type optical modulator module using piezoelectric elements, applicable to an embodiment of the invention.
Figure 2B:
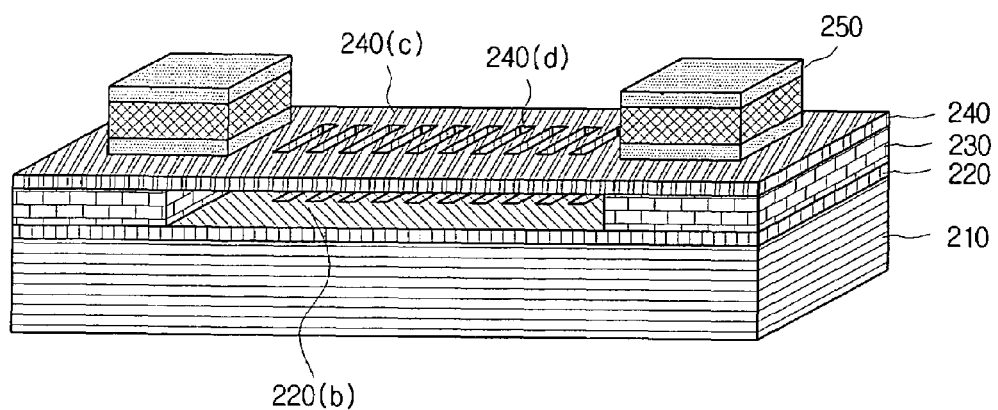
FIG. 2B is a perspective view of another diffraction type optical modulator module using piezoelectric elements, applicable to an embodiment of the invention.

FIG. 2A is a perspective view of a diffraction type optical modulator module using piezoelectric elements, applicable to an embodiment of the invention, and FIG. 2B is a perspective view of another diffraction type optical modulator module using piezoelectric elements, applicable to an embodiment of the invention. FIGS. 2A and 2B each illustrate an optical modulator, comprising a substrate 210, an insulation layer 220, a sacrificial layer 230, a ribbon structure 240, and piezoelectric elements 250.

The substrate 210 is a commonly used semiconductor substrate, and the insulation layer 220 is deposited as an etch stop layer. The insulation layer 220 is formed from a material with a high selectivity to the etchant (the etchant is an etchant gas or an etchant solution) that etches the material used as the sacrificial layer. Here, reflective layers 220(a), 220(b) may be formed on the insulation layer 220 to reflect incident beams of light.

The sacrificial layer 230 supports the ribbon structure 240 such that the ribbon structure is displaced by a particular gap from the insulation layer 220, and forms a space in the center.

The ribbon structure 240 creates diffraction and interference in the incident light to provide optical modulation of signals as described above. The form of the ribbon structure 240 may be composed of a plurality of ribbon shapes according to the electrostatic type, and may comprise a plurality of open holes in the center portion of the ribbons according to the piezoelectric type. The piezoelectric elements 250 control the ribbon structure 240 to move vertically, according to the degree of up/down or left/right contraction and expansion generated by the difference in voltage between the upper and lower electrodes. Here, the reflective layers 220(a), 220(b) are formed in correspondence with the holes 240(b), 240(d) formed in the ribbon structure 245.

For example, in the case that the wavelength of the light equals λ, when there is no power supplied or when there is a predetermined amount of power supplied, the gap between an upper reflective layer 240(a), 240(c) formed on the ribbon structure and the insulation layer 220, on which is formed a lower reflective layer 220(a), 220(b), is equal to nλ/2 (wherein n is a natural number). Accordingly, in the case of a zeroth (0th) order diffracted light (reflected light) beam, the overall path difference between the light reflected from the upper reflective layer 240(a), 240(c) formed on the ribbon structure and the light reflected from the insulation layer 220 is equal to nλ, so that the modulated light has a maximum brightness due to a constructive interference. On the other hand, in the case of +1st and −1st order diffracted light, by which the brightness is at its minimum level due to a destructive interference.

Also, when an appropriate amount of power is supplied to the piezoelectric elements 250, other than the supplied power mentioned above, the gap between the upper reflective layer 240(a), 240(c) formed on the ribbon structure and the insulation layer 220, on which is formed the lower reflective layer 220(a), 220(b), becomes $(2n+1)\lambda/4$ (wherein n is a natural number). Accordingly, in the case of 0th-order diffracted light (reflected light) beam, the overall path difference between the light reflected from the upper reflective layer 240(a), 240(c) formed on the ribbon structure and the light reflected from the insulation layer 220 equals to $(2n+1)\lambda/2$, so that the modulated light has its minimum brightness due to a destructive interference. However, in the case of +1st and −1st order diffracted light, the brightness is at its maximum level due to a constructive interference. As a result of such interference, the optical modulator can load signals on the light beam by regulating the quantity of the reflected or diffracted light.

Although the foregoing describes the cases in which the gap between the ribbon structure 240 and the insulation layer 220 on which the lower reflective layer 220(a), 220(b) is formed is equal to $(2n)\lambda/4$ or $(2n+1)\lambda/4$, it is obvious that a variety of embodiments, having the gap with which the intensity of light is controlled by diffraction and reflection, can be applied to the present invention.

The descriptions below will focus on the type of optical modulator illustrated in FIG. 2A.

Figure 2C:
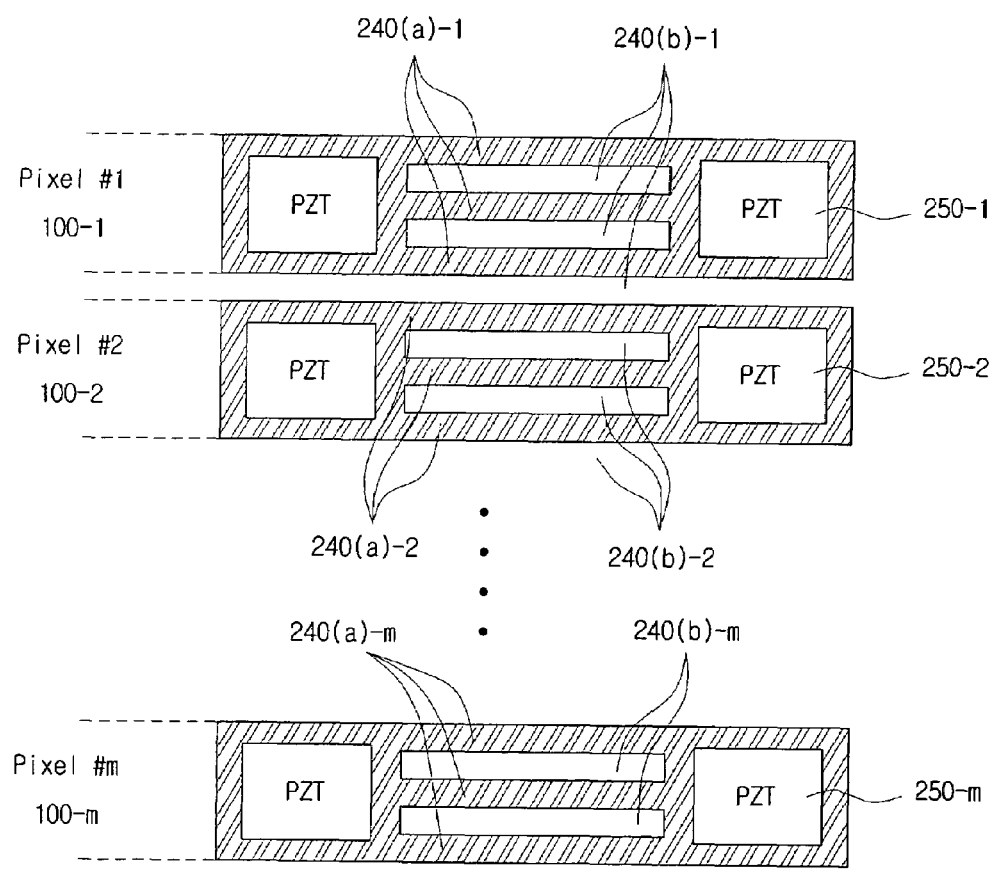
FIG. 2C is a plan view of a diffraction type optical modulator array applicable to an embodiment of the present invention.

As shown in FIG. 2C, the optical modulator has an m number of micro-mirrors 100-1, 100-2, . . . , and 100-m, respectively responsible for pixel #1, pixel #2, . . . , and pixel #m. The optical modulator deals with image information with respect to one-dimensional images of a vertical or horizontal scanning line (here, it is assumed that a vertical or horizontal scanning line consists of an m number of pixels), and each micro-mirror 100-1, 100-2, . . . , 100-m deals with one of the m pixels constituting the vertical or horizontal scanning line. Accordingly, the light beam reflected and diffracted by each micro-mirror is later projected by an optical scanning device on a screen as a two-dimensional image. For instance, in the case of VGA 640*480 resolution, 480 vertical pixels are modulated 640 times on one surface of the optical scanning device (not shown in the accompanying drawings) so as to generate one frame per surface of the optical scanning device. Here, the optical scanning device may be a polygon mirror, a rotating bar, or a galvano mirror.

Below here, although the principle of optical modulation will be set forth with an example of the pixel #1, the following description can be applied to the other pixels in the same way.

In the present embodiment, it is assumed that two holes 240(b)-1 are formed in the ribbon structure 240. Due to the two holes 240(b)-1, there are three upper reflective layers 240(a)-1 formed on an upper part of the ribbon structure 240. On the insulation layer 220 are formed two lower reflective layers in correspondence with the two holes 240(b)-1. Besides, another lower reflective layer is formed on the insulation layer 220 in correspondence with a gap between the pixel #1 and the pixel #2. Consequently, the number of the upper reflective layers 240(a)-1 per pixel is the same as the number of the lower reflective layers, and the brightness of the modulated light can be controlled by using the modulated light (0th order diffracted light or ±1st order diffracted light).

Figure 2D:
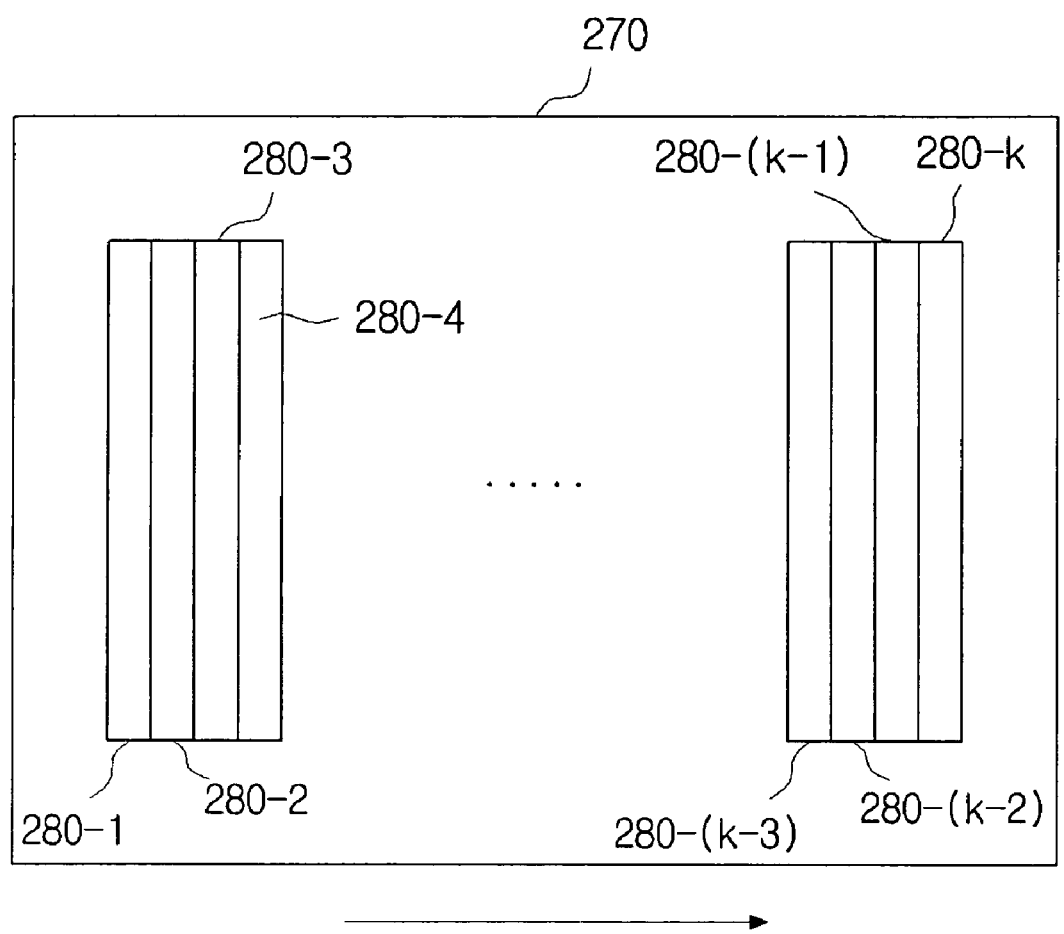
FIG. 2D is a schematic diagram illustrating an image generated on a screen by means of a diffraction type optical modulator array applicable to an embodiment of the invention.

FIG. 2D shows an image generated by a diffraction type optical modulator array applicable to embodiments of the present invention.

The light reflected and diffracted by a k number of vertically arranged micro-mirrors 100-1, 100-2, . . . , and 100-k is reflected from the optical scanning device, and then scanned horizontally on a screen 270, thereby generating a picture 280-1, 280-2, 280-3, 280-4, . . . , 280-(k-3), 280-(k-2), 280-(k-1), 280-k. One image frame may be projected with one revolution of the optical scanning device. Here, although the scanning is performed from left to right (the arrow indicating direction), it is apparent that images can be scanned in other directions (e.g. in the opposite direction).

The present invention relates to a test pattern for testing a variety of connecting methods to interconnect an element and a substrate. The pattern is proposed to detect an open and a short, in a packaging process electrically connecting a chip having a fine circuit to the substrate. A method to obtain such a pattern will be outlined in the following. Pads formed on an element or a substrate are divided into two groups. The two groups are electrically insulated from each other, but the pads belonging to a same group are electrically connected each other. Accordingly, an open in the interconnection can be detected by measuring a current or a resistance between measuring pads belonging to a same group, and a short can be detected by measuring a current or a resistance between measuring pads each belonging to a different group.

Here, the pad group comprises substrate pads formed on the substrate and element pads formed on the element. The substrate pads constituting the pad group are again grouped into sub groups, namely, substrate pad sub groups, each of which having a predetermined number of the substrate pads connected in a row. Such substrate pad sub groups are insulated from each other, but may be electrically connected by the element pads connected with a predetermined wiring. Here, the substrate pad sub group consisting of two substrate pads is called a pair of substrate pads.

Accordingly, a first pad group comprises a plurality of first substrate pad sub groups and a plurality of first element pad sub groups. The first substrate pad sub group comprises a predetermined number of first substrate pads formed on the substrate and electrically connected in a row by a wiring or other conductor, and is insulated from other first substrate pad sub groups. Meanwhile, the first element pad sub group comprises a predetermined number of the first element pads formed on the element, and electrically connected by a wiring or other conductor such that each first substrate pad sub group is electrically connected through the first element pad corresponding to the first substrate pad. A second pad group comprises a plurality of second substrate pad sub groups and a plurality of second element pad sub groups. Here, the second substrate pad sub group comprises a predetermined number of second substrate pads formed on the substrate and electrically connected in a row by a wiring, and is insulated from other second substrate pad sub groups. Meanwhile, the second element pad sub group comprises a predetermined number of the second element pads formed on the element, and electrically connected by a wiring or other conductor such that the second substrate pad sub group is electrically connected through the second element pad corresponding to the second substrate pad. In the present invention are further disposed a plurality of first measuring pads and a plurality of second measuring pads. Here, the plurality of the first measuring pads are electrically connected with the first pad group, and the plurality of the second measuring pads are electrically connected with the second pad group. Accordingly, an open between the pads can be detected by checking a connected state between the first or second measuring pads, and a short between the pads can be detected by checking a connected state between the first and second measuring pads.

Hereinafter, five embodiments of a semiconductor chip package capable of detecting an open and a short will be described in detail with reference to the accompanying drawings one by one. Here, a variety of methods can be proposed to form a semiconductor chip package (for example, a flip chip bonding method, a wire bonding method, and the like), but the descriptions below will concentrate on the flip chip bonding. Also, in the descriptions below, a pair of the substrate pads constitutes one substrate pad sub group.

Figure 3:
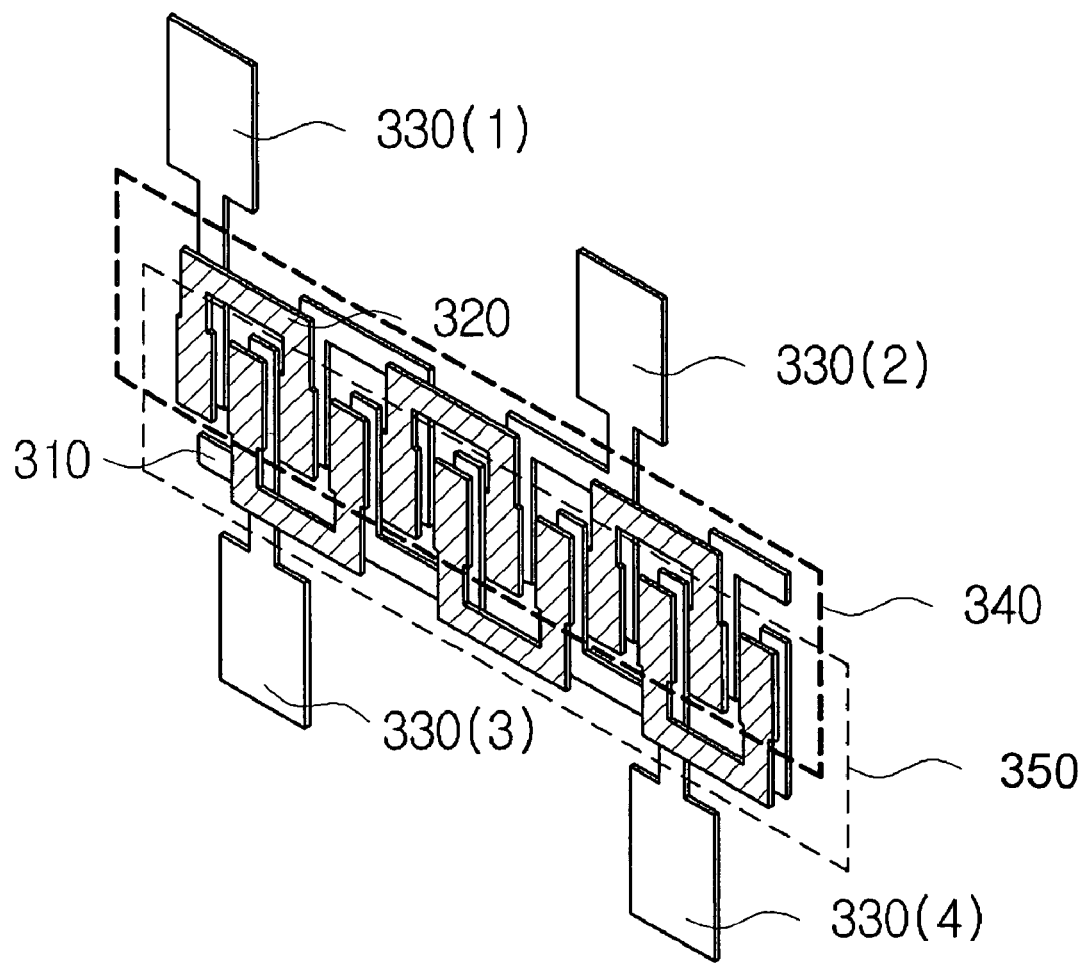
FIG. 3 is a perspective view of a semiconductor chip package capable of detecting an open and a short according to a first embodiment of the present invention.

FIG. 3 is a perspective view of a semiconductor chip package capable of detecting an open and a short according to a first embodiment of the present invention. In FIG. 3 are illustrated substrate pads 310, element pads 320, measuring pads 330(1), 330(2), 330(3) and 330(4), a first pad group 340, and a second pad group 350.

The substrate pads 310 are electrically connected in pairs by a wiring on a substrate, and each pair of the substrate pads is insulated from another pair of substrate pads.

The element pads 320 are connected in pairs on an element by a wiring in correspondence with the pairs of substrate pads to connect the corresponding pairs of substrate pads electrically.

The first pad group 340 is insulated from the second pad group 350 when the element is connected to the substrate (by a flip chip bonding or a wire bonding, for example). The first pad group 340 comprises a plurality of first substrate pads formed on the substrate and connected in pairs, each pair of which is insulated from another pair of the first substrate pads. The first pad group 340 further comprises a plurality of first element pads formed on the element, and connected in pairs by a wiring such that each pair of first substrate pad is electrically connected through the corresponding pairs of the first elements pads.

Meanwhile, the second pad group 350 comprises a plurality of second substrate pads formed on the substrate and connected in pairs by, for example, a wiring, each pair of which is insulated from another pair of the second substrate pads. Here, each second substrate pad is sandwiched between the two corresponding first substrate pads. The second pad group 350 further comprises a plurality of second element pads formed on the element, and connected in pairs by, for example, a wiring such that each pair of second substrate pads is electrically connected through the corresponding pairs of the second elements pads. Consequently, when the element is connected to the substrate (by the flip chip bonding or the wire bonding, for example), the first pad group 340 and the second pad group 350 form a shape of meshing each other, being insulated from each other.

The measuring pads 330(1) and 330(2) are formed on the substrate to be combined with the first pad group 340, and the measuring pads 330(3) and 330(4) are formed on the substrate to be combined with the second pad group 350. Accordingly, the test pattern monitors an open between the pads by checking a connected state between the measuring pads 330(1) and 330(2) combined with the first pad group 340 or the measuring pads 330(3) and 330(4) combined with the second pad group 350. Also, the test pattern monitors a short between the pads by checking a connected state between one of the measuring pads 330(1) and 330(2) combined with the first pad group 340 and one of the measuring pads 330(3) and 330(4) combined with the second pad group 350.

Figure 4:
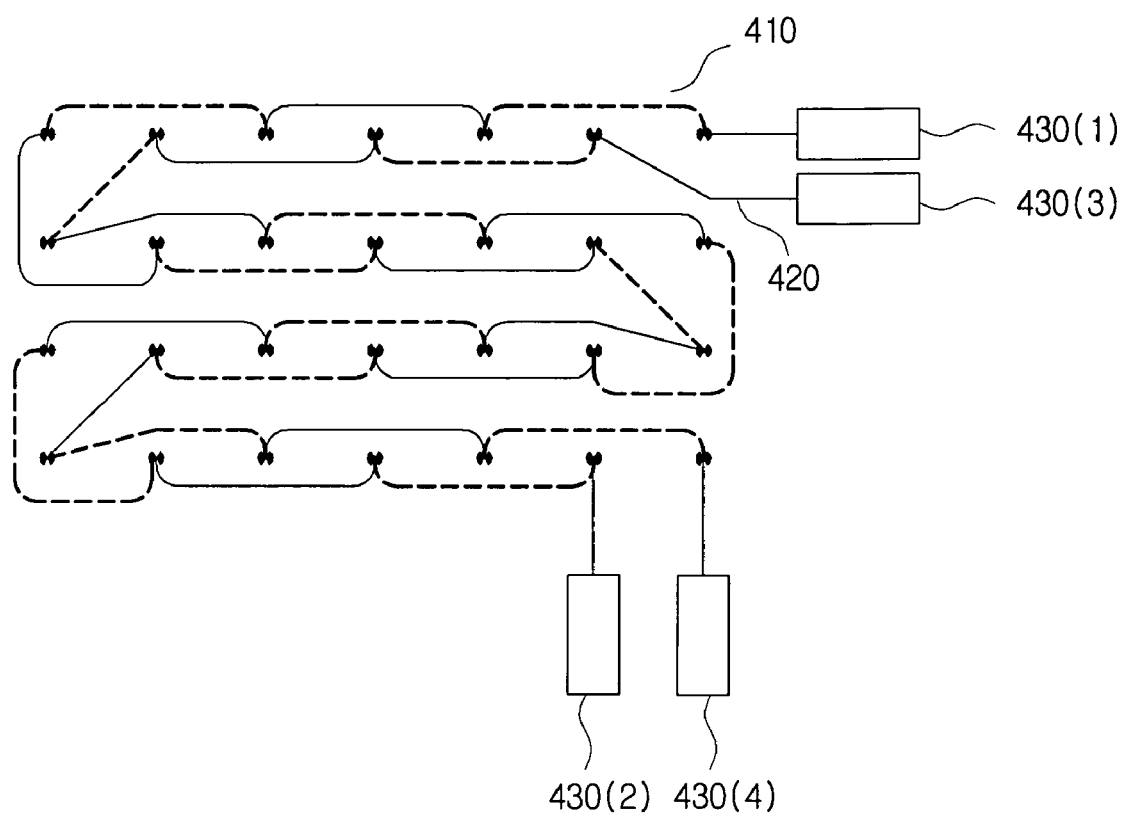
FIG. 4 is a plan view of a semiconductor chip package capable of detecting an open and a short according to a second embodiment of the present invention.

FIG. 4 is a plan view of a semiconductor chip package capable of detecting an open and a short according to a second embodiment of the present invention. In FIG. 4 are illustrated a first pad group 410, a second pad group 420, and measuring pads 430(1), 430(2), 430(3), and 430(4). Here, the descriptions below on the second embodiment concentrate on differences from the first embodiments. Hereinafter, a solid line represents a wiring between element pads, and a dotted line represents a wiring between substrate pads.

Substrate pads and element pads formed with corresponding to the substrate pads are arranged in a zigzag pattern. Such an arrangement is called an areal pattern. The pads arranged in a row are electrically connected in the same way as the first embodiment, but the pads in a curved part are arranged in a way such that the first pad group 410 and the second pad group 420 are insulated from each other. Consequently, a test pattern monitors an open between the pads by checking a connected state between the measuring pads 430(1) and 430(2), or 430(3) and 430(4) combined with the same group. Also, the test pattern monitors a short between the pads by checking a connected state between one of the measuring pads 430(1), 430(2) belonging to the first pad group 340 and one of the measuring pads 430(3), 430(4) belonging to the second pad group 350.

Figure 5:
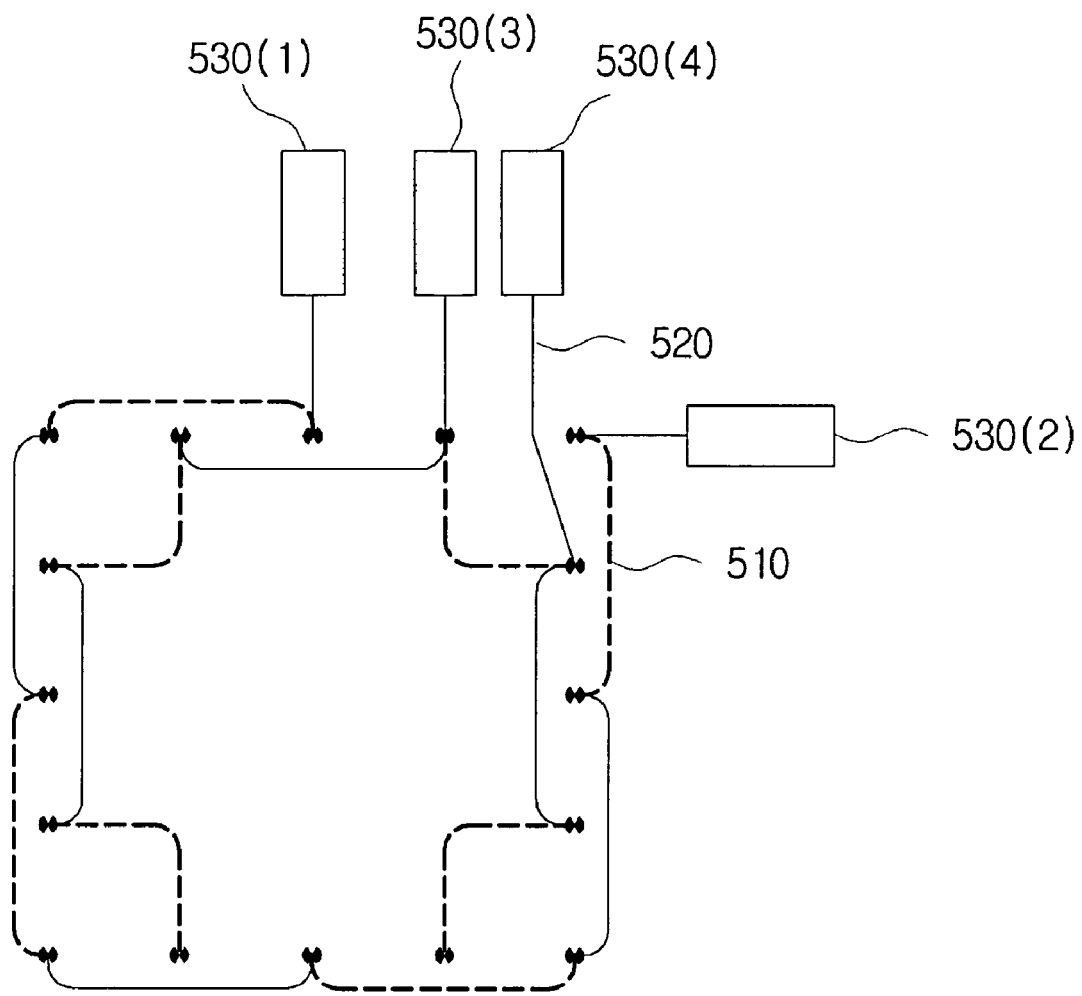
FIG. 5 is a plan view of a semiconductor chip package capable of detecting an open and a short according to a third embodiment of the present invention.

FIG. 5 is a plan view of a semiconductor chip package capable of detecting an open and a short according to a third embodiment of the present invention. In FIG. 5 are illustrated a first pad group 510, a second pad group 520, and measuring pads 530(1), 530(2), 530(3), and 530(4). Here, the descriptions below on the third embodiment concentrate on differences from the first embodiments.

Substrate pads and corresponding elements pads are arranged along a peripheral of a substrate. Such an arrangement is called a peripheral pattern. The pads arranged in a row are electrically connected in the same way as the first embodiment, but the pads in a curved part are arranged in a way such that the first pad group 510 and the second pad group 520 are insulated from each other. Consequently, a test pattern monitors an open between the pads by checking a connected state between the measuring pads 530(1) and 530(2), or 530(3) and 530(4) combined with the same group. Also, the test pattern monitors a short between the pads by checking a connected state between one of the measuring pads 530(1), 530(2) belonging to the first pad group 510 and one of the measuring pads 530(3), 530(4) belonging to the second pad group 520.

Figure 6:
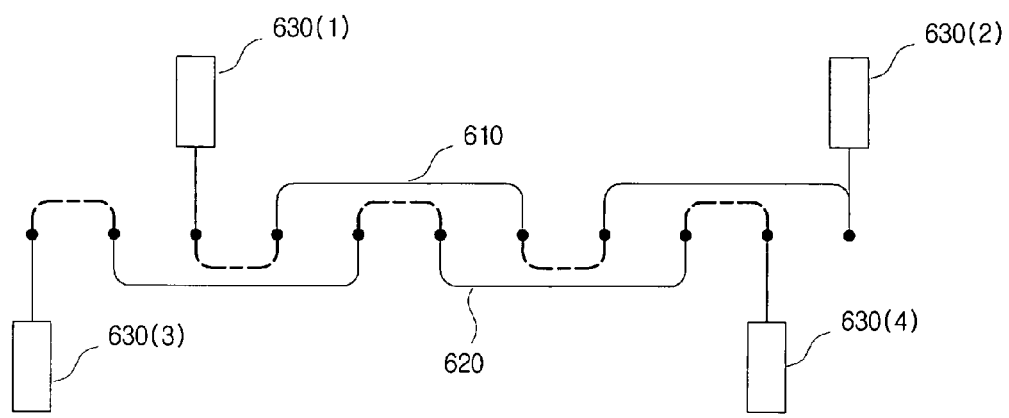
FIG. 6 is a plan view of a semiconductor chip package capable of detecting an open and a short according to a fourth embodiment of the present invention.

FIG. 6 is a plan view of a semiconductor chip package capable of detecting an open and a short according to a fourth embodiment of the present invention. In FIG. 6 are illustrated a first pad group 610, a second pad group 620, and measuring pads 630(1), 630(2), 630(3), and 630(4). Here, the descriptions below on the fourth embodiment concentrate on differences from the first embodiments.

The first pad group 610 and the second pad group 620 form a shape of meshing each other, being insulated from each other. In the first embodiment, each second substrate pad was sandwiched between two neighboring first substrate pads. However, in the fourth embodiment, pairs of pads form a meshed shape. Consequently, a test pattern monitors an open between the pads by checking a connected state between the measuring pads 630(1) and 630(2), or 630(3) and 630(4) combined with the same group. Also, the test pattern monitors a short between the pads by checking a connected state between one of the measuring pads 630(1), 630(2) belonging to the first pad group 610 and one of the measuring pads 630(3), 630(4) belonging to the second pad group 620.

Figure 7:
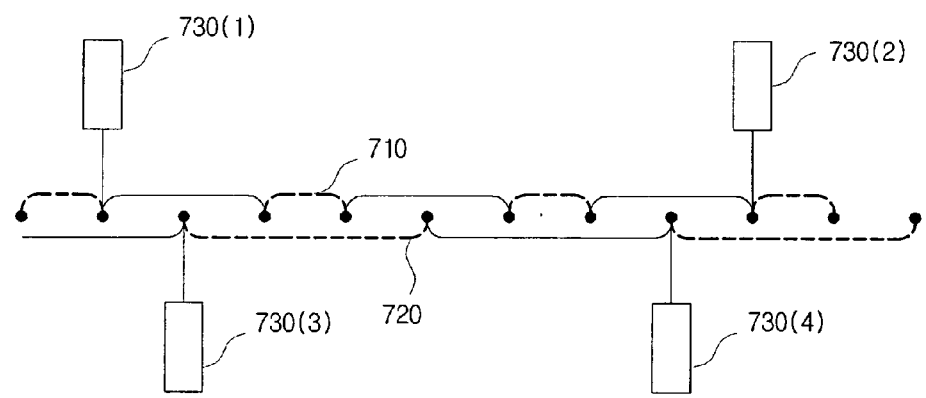
FIG. 7 is a plan view of a semiconductor chip package capable of detecting an open and a short according to a fifth embodiment of the present invention.

FIG. 7 is a plan view of a semiconductor chip package capable of detecting an open and a short according to a fifth embodiment of the present invention. In FIG. 7 are illustrated a first pad group 710, a second pad group 720, and measuring pads 730(1), 730(2), 730(3), and 730(4). Here, the descriptions below on the fifth embodiment concentrate on differences from the first embodiments.

The first pad group 710 and the second pad group 720 form a shape of meshing each other, being insulated from each other. In the first embodiment, each first pad was sandwiched between two neighboring second pads, but in the fifth embodiment, pairs of pads form a meshed shape. More specifically, the pair of pads belonging to the second pad group 720 accommodates the corresponding pair of pads belonging to the first pad group 710. Consequently, a test pattern monitors an open between the pads by checking a connected state between the measuring pads 730(1) and 730(2), or 730(3) and 730(4) combined with the same group. Also, the test pattern monitors a short between the pads by checking a connected state between one of the measuring pads 730(1), 730(2) belonging to the first pad group 710 and one of the measuring pads 730(3), 730(4) belonging to the second pad group 720.

While the invention has been described with reference to the disclosed embodiments, it is to be appreciated that those skilled in the art can change or modify the embodiments without departing from the scope and spirit of the invention or its equivalents as stated below in the claims.

What is claimed is:

1. A semiconductor chip package detecting an open and a short, comprising:
    a first pad group comprising
        a plurality of first substrate pad sub groups, formed on a substrate, each composed of first substrate pads electrically connected, and insulated from each other, and
        a plurality of first element pad sub groups composed of first element pads electrically connected such that each first substrate pad sub group is electrically connected through the first element pads corresponding to the first substrate pads wherein the plurality of first element pad sub group contact with a first element connected to the substrate;
    a second pad group electrically insulated from the first pad group when the element is electrically connected to the substrate, and comprising
        a plurality of second substrate pad sub groups formed on the substrate, composed of second substrate pads electrically connected, and insulated from each other, and
        a plurality of second element pad sub groups composed of second element pads electrically connected such that each second substrate pad sub group is electrically connected through the second element pads corresponding to the second substrate pads wherein the plurality of second element pad sub group contact with either the first element or a second element connected to the substrate;
    a plurality of first measuring pads electrically connected with the first pad group; and
    a plurality of second measuring pads electrically connected with the second pad group,
    wherein an open between the pads is detected by checking a connected state between the first or second measuring pads, and a short between the pads is detected by checking a connected state between the first and second measuring pads.

2. The semiconductor chip package detecting an open and a short of claim 1, wherein the first substrate pad sub group and the second substrate pad sub group are arranged alternatively and sequentially.

3. The semiconductor chip package detecting an open and a short of claim 1, wherein the first substrate pad sub group is formed of a pair of the first substrate pads.

4. The semiconductor chip package detecting an open and a short of claim 1, wherein the second substrate pad sub group is formed of a pair of the second substrate pads.

5. The semiconductor chip package detecting an open and a short of claim 1, wherein the substrate is a transparent substrate.

6. The semiconductor chip package detecting an open and a short of claim 1, wherein the first and second substrate pads are arranged in an areal pattern or in a peripheral pattern.

7. The semiconductor chip package detecting an open and a short of claim 1, wherein the number of the first measuring pads is two, and the number of the second measuring pads is two.

8. The semiconductor chip package detecting an open and a short of claim 1, wherein the plurality of the first measuring pads are formed at both ends of the first pad group.

9. The semiconductor chip package detecting an open and a short of claim 1, wherein the plurality of the second measuring pads are formed at both ends of the second pad group.

10. The semiconductor chip package detecting an open and a short of claim 1, wherein the element is connected to the substrate by a wire bonding method or a flip chip bonding method.

11. A semiconductor chip package detecting an open and a short, comprising:
    a first pad group comprising a plurality of pairs of first substrate pads, formed on a substrate, each composed of a pair of electrically connected first substrate pads, and insulated from each other, and a plurality of pairs of first element pads, composed of a pair of first element pads electrically connected such that each pair of first substrate pads is electrically connected through the first element pads corresponding to the first substrate pads wherein the plurality of first element pad sub group contact with a first element connected to the substrate;
    a second pad group electrically insulated from the first pad group when the element is electrically connected to the substrate, and comprising a plurality of pairs of second substrate pads, each composed of a pair of electrically connected second substrate pads, and insulated from each other, and a plurality of pairs of second element pads, formed on the element, and each composed of a pair of second element pads electrically connected such that each pair of second substrate pads is electrically connected through the second element pads corresponding to the second substrate pads wherein the plurality of second element pads sub group contact with either the first element or a second element connected to the substrate
    a plurality of first measuring pads electrically connected with the first pad group; and
    a plurality of second measuring pads electrically connected with the second pad group,
    wherein an open between the pads is detected by checking a connected state between the first or second measuring pads, and a short between the pads by checking a connected state between the first and second measuring pads.

12. The semiconductor chip package detecting an open and a short of claim 1, wherein the element is an optical modulator or a drive IC driving an optical modulator.

13. The semiconductor chip package detecting an open and a short of claim 11, wherein the element is an optical modulator or a drive IC driving an optical modulator.

14. The semiconductor chip package detecting an open and a short of claim 5, wherein the substrate is a transparent substrate.

15. The semiconductor chip package detecting an open and a short of claim 11, wherein the first and second substrate pads are arranged in an areal pattern or in a peripheral pattern.

16. The semiconductor chip package detecting an open and a short of claim 11, wherein the number of the first measuring pads is two, and the number of the second measuring pads is two.

17. The semiconductor chip package detecting an open and a short of claim 11, wherein the plurality of the first measuring pads are formed at both ends of the first pad group.

18. The semiconductor chip package detecting an open and a short of claim 11, wherein the plurality of the second measuring pads are formed at both ends of the second pad group.

19. The semiconductor chip package detecting an open and a short of claim 11, wherein the element is connected to the substrate by a wire bonding method or a flip chip bonding method.

* * * * *

UNITED STATES PATENT AND TRADEMARK OFFICE
CERTIFICATE OF CORRECTION

| PATENT NO. | : 7,394,261 B2 |
|---|---|
| APPLICATION NO. | : 11/546594 |
| DATED | : July 1, 2008 |
| INVENTOR(S) | : C.-S. Park et al. |

It is certified that error appears in the above-identified patent and that said Letters Patent is hereby corrected as shown below:

| COLUMN | LINE | ERROR |
|---|---|---|
| 10 (Claim 11, | 48 line 26) | at the end of the second sub-paragraph, following the word "substrate" insert --;-- |
| 10 (Claim 14, | 66 line 2) | "claim 5," should read --claim 11,-- |

Signed and Sealed this
Thirteenth Day of September, 2011

David J. Kappos
*Director of the United States Patent and Trademark Office*